US012812762B2

(12) United States Patent
Balakrishnan et al.

(10) Patent No.: US 12,812,762 B2
(45) Date of Patent: Nov. 24, 2026

(54) CIRCUIT BOARD ASSEMBLY FOR BATTERY MODULE

(71) Applicant: Caterpillar Inc., Peoria, IL (US)

(72) Inventors: Bharath Balakrishnan, Payyannur (IN); Benjamin Avery Tabatowski-Bush, Saline, MI (US)

(73) Assignee: Caterpillar Inc., Peoria, IL (US)

( * ) Notice: Subject to any disclaimer, the term of this patent is extended or adjusted under 35 U.S.C. 154(b) by 277 days.

(21) Appl. No.: 18/744,819

(22) Filed: Jun. 17, 2024

(65) Prior Publication Data

US 2025/0386418 A1 Dec. 18, 2025

(51) Int. Cl.

| | |
|---|---|
| ***H05K 1/02*** | (2006.01) |
| ***H01M 10/42*** | (2006.01) |
| ***H01M 10/48*** | (2006.01) |
| ***H01M 50/284*** | (2021.01) |
| ***H05K 1/03*** | (2006.01) |

(52) U.S. Cl.

CPC ...... *H05K 1/0201* (2013.01); *H01M 10/4257* (2013.01); *H01M 10/482* (2013.01); *H01M 10/486* (2013.01); *H01M 50/284* (2021.01); *H05K 1/036* (2013.01); *H01M 2010/4271* (2013.01); *H05K 2201/10015* (2013.01); *H05K 2201/10022* (2013.01);

(Continued)

(58) Field of Classification Search

CPC .................................................... H05K 1/0201
USPC ......................................................... 174/252
See application file for complete search history.

(56) References Cited

U.S. PATENT DOCUMENTS

| | | | |
|---|---|---|---|
| 9,609,737 | B2 | 3/2017 | Kim et al. |
| 2007/0259160 | A1 | 11/2007 | Huang |

(Continued)

FOREIGN PATENT DOCUMENTS

| | | | |
|---|---|---|---|
| CN | 104052106 | A | 9/2014 |
| CN | 107734946 | | 2/2018 |

(Continued)

OTHER PUBLICATIONS

Guran Ionut Constantin et al: 4-Cell Passive Battery Management System for Automotive Applications ,2021 IEEE 27th International Symposium for Design and Technology in Electronic Packaging (SIITME), pp. 338-341, IEEE, Oct. 27, 2021 (Oct. 27, 2021).

(Continued)

*Primary Examiner* — Stanley Tso
(74) *Attorney, Agent, or Firm* — ConcurIP Consulting Pvt. Ltd

(57) ABSTRACT

A circuit board assembly for a battery module includes a first printed circuit board (PCB) including a plurality of balancing resistors and a plurality of balancing circuit switches corresponding to the plurality of balancing resistors. The first PCB includes at least one metallic layer. The plurality of balancing resistors and the plurality of balancing circuit switches perform a cell balancing operation of a plurality of battery cells of the battery module. Heat generated during the cell balancing operation of the plurality of battery cells is dissipated via the first PCB. The circuit board assembly also includes a second PCB. The second PCB includes a plurality of resistor-capacitor (RC) low-pass filters and an analog front-end (AFE) chip that is adapted to at least monitor a voltage and a temperature of the plurality of battery cells of the battery module.

16 Claims, 6 Drawing Sheets

(52) U.S. Cl.
CPC .............. *H05K 2201/10037* (2013.01); *H05K 2201/10053* (2013.01); *H05K 2201/1006* (2013.01)

(56) References Cited

U.S. PATENT DOCUMENTS

| | | | | |
|---|---|---|---|---|
| 2013/0108894 | A1* | 5/2013 | Jung | H01M 10/425<br>429/7 |
| 2019/0341168 | A1* | 11/2019 | Yonemori | H01B 7/08 |
| 2021/0293629 | A1* | 9/2021 | Haraguchi | G01K 1/14 |
| 2022/0255194 | A1 | 8/2022 | Crowley et al. | |

FOREIGN PATENT DOCUMENTS

| | | | |
|---|---|---|---|
| EP | 2978044 | A1 | 1/2016 |
| JP | 2006173243 | | 6/2006 |
| WO | 2012178205 | | 12/2012 |

OTHER PUBLICATIONS

Written Opinion and International Search Report for Int'l. Patent Appln. No. PCT/US2025/032577, mailed Oct. 20, 2025 (17 pgs).

* cited by examiner

CIRCUIT BOARD ASSEMBLY FOR BATTERY MODULE

TECHNICAL FIELD

The present disclosure relates to a battery module, and more particularly, to a circuit board assembly for the battery module and a method of dissipating heat generated in the circuit board assembly for the battery module.

BACKGROUND

Battery modules typically include a large number of battery cells arranged in series and/or parallel configuration to achieve desired voltage and output current. It is important to operate each battery cell within an optimal voltage range. However, these battery cells may vary in charging capacity, discharging capacity, and/or state of charge, leading to a slight voltage difference between the battery cells during repetitive charging and discharging cycles. This results in overcharging of some battery cells, a phenomenon known as cell imbalance, which may reduce a lifespan and an efficiency of the battery cells. To address this issue, it is necessary to balance the imbalanced cells. One common method for cell balancing is passive cell balancing.

Conventional passive cell balancing employs control switches, such as metal-oxide semiconductor field-effect transistors (MOSFETs), and resistors to discharge the excess charge from an imbalanced cell. However, this process may generate a significant amount of heat, which needs to be dissipated quickly to ensure efficient operation of the battery cells and to prevent damage to the MOSFETs, resistors, or other components of the battery module. Therefore, there is a need to facilitate rapid heat dissipation during a cell balancing operation.

U.S. Published Application Number 2022/0255194 describes electronics boards to span between cell terminals of multiple energy storage units. In various aspects, the electronics boards include at least one terminal coupling region configured as a primary path of electrical current between the electronics board and the cell unit terminals, at least one circuit region comprising at least a first conductive layer and a second non-conductive layer, and two or more electronic components disposed on the one or more electronics boards and connecting to the conductive layer in the circuit region. The terminal coupling regions and/or at least one part of the circuit regions have a defined mechanical bending characteristic and/or a combined thickness characteristic so as to permit at least some displacement from the predetermined geometrical alignment.

SUMMARY OF THE DISCLOSURE

In an aspect of the present disclosure, a circuit board assembly for a battery module is provided. The circuit board assembly includes a first printed circuit board (PCB) including a plurality of balancing resistors and a plurality of balancing circuit switches corresponding to the plurality of balancing resistors. The first PCB includes at least one metallic layer. The plurality of balancing resistors and the plurality of balancing circuit switches perform a cell balancing operation of a plurality of battery cells of the battery module. Heat generated during the cell balancing operation of the plurality of battery cells is dissipated via the first PCB. The circuit board assembly also includes a second PCB. The second PCB includes a plurality of resistor-capacitor (RC) low-pass filters and an analog front-end (AFE) chip that is adapted to at least monitor a voltage and a temperature of the plurality of battery cells of the battery module. The circuit board assembly further includes a first connector adapted to connect the first PCB with the second PCB.

In another aspect of the present disclosure, a battery module is provided. The battery module includes a housing and a plurality of battery cells disposed within the housing. The battery module also includes a circuit board assembly disposed within the housing and in communication with the plurality of battery cells. The circuit board assembly includes a first printed circuit board (PCB) including a plurality of balancing resistors and a plurality of balancing circuit switches corresponding to the plurality of balancing resistors. The first PCB includes at least one metallic layer. The plurality of balancing resistors and the plurality of balancing circuit switches perform a cell balancing operation of the plurality of battery cells of the battery module. Heat generated during the cell balancing operation of the plurality of battery cells is dissipated via the first PCB. The circuit board assembly also includes a second PCB. The second PCB includes a plurality of resistor-capacitor (RC) low-pass filters and an analog front-end (AFE) chip that is adapted to at least monitor a voltage and a temperature of the plurality of battery cells of the battery module. The circuit board assembly further includes a first connector adapted to connect the first PCB with the second PCB.

In another aspect of the present disclosure, a method of dissipating heat generated in a circuit board assembly for a battery module is provided. The method includes providing a first printed circuit board (PCB) including a plurality of balancing resistors and a plurality of balancing circuit switches corresponding to the plurality of balancing resistors. The first PCB includes at least one metallic layer. The method also includes providing a second PCB. The second PCB includes a plurality of resistor-capacitor (RC) low-pass filters and an analog front-end (AFE) chip that is adapted to at least monitor a voltage and a temperature of the plurality of battery cells of the battery module. The method further includes connecting, via a first connector, the first PCB with the second PCB. The method includes performing, via the plurality of balancing resistors and the plurality of balancing circuit switches, a cell balancing operation of the plurality of battery cells of the battery module. The method also includes dissipating, via the first PCB, heat generated during the cell balancing operation of the plurality of battery cells.

DETAILED DESCRIPTION

Wherever possible, the same reference numbers will be used throughout the drawings to refer to same or like parts.

Figure 1:
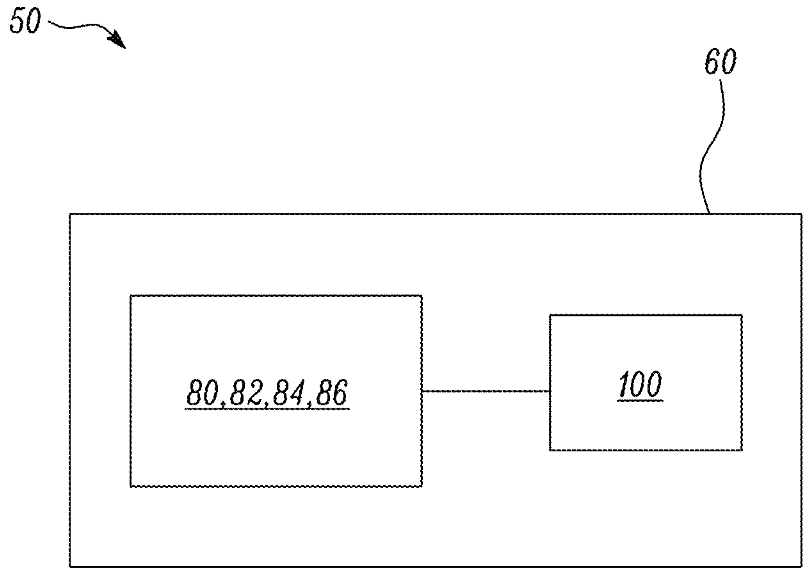
FIG. 1 is a block diagram of an exemplary battery module.
Figure 2:
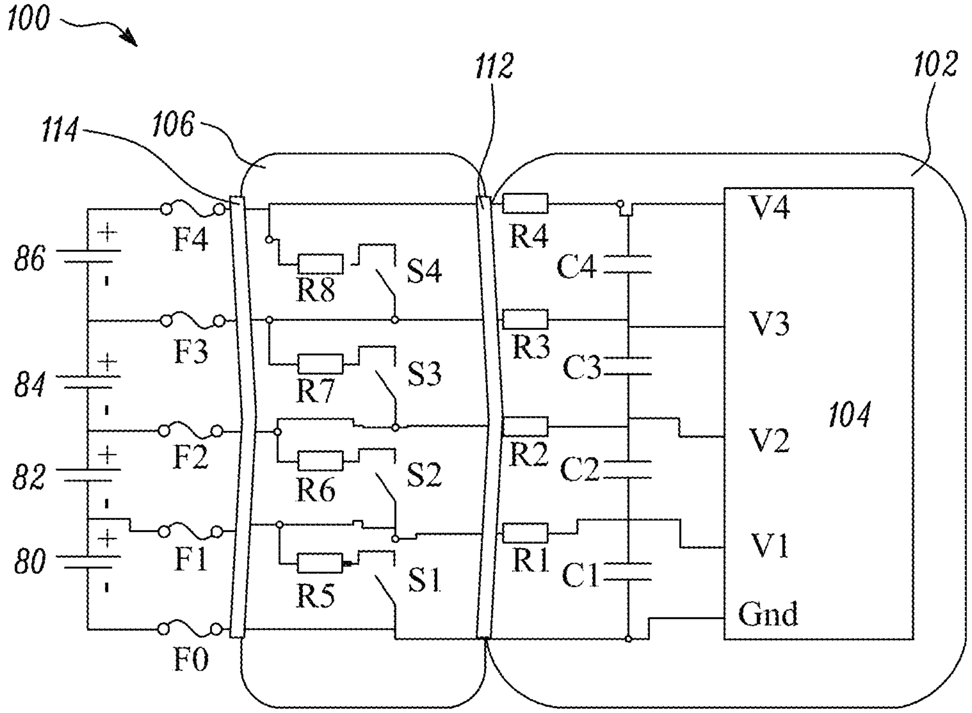
FIG. 2 is a schematic diagram of the battery module of FIG. 1 having a circuit board assembly, according to an example of the present disclosure.

FIG. 1 illustrates a block diagram of a battery module 50. The battery module 50 includes a housing 60. The battery module 50 also includes a number of battery cells 80, 82, 84, 86 disposed within the housing 60. Referring to FIGS. 1 and 2, the battery cells 80, 82, 84, 86 may be connected in a series arrangement, a parallel arrangement, or a combination thereof. In the illustrated example of FIGS. 1 and 2, the number of battery cells 80, 82, 84, 86 are connected in series to provide a current to a load device (not shown). The battery module 50 is shown to have four battery cells 80, 82, 84, 86 as an example. However, the number of battery cells 80, 82, 84, 86 in the battery module 50 may vary depending on application requirements. The battery module 50 also includes a number of fuses F0, F1, F2, F3, F4 to provide overcurrent protection to the battery module 50. A total number of the fuses F0, F1, F2, F3, F4 is one more than the number of battery cells 80, 82, 84, 86 associated with the battery module 50.

The battery module 50 further includes a circuit board assembly 100 disposed within the housing 60 and in communication with the number of battery cells 80, 82, 84, 86. The circuit board assembly 100 may form a part of a control system that, at least in part, controls an operation of the battery module 50. In addition to the circuit board assembly 100, the control system may also include other control devices/controllers associated therewith.

Referring to FIG. 2, the circuit board assembly 100 includes a first printed circuit board (PCB) 106. The first PCB 106 includes a number of balancing resistors R5, R6, R7, R8 and a number of balancing circuit switches S1, S2, S3, S4 corresponding to the number of balancing resistors R5, R6, R7, R8. The number of balancing resistors R5, R6, R7, R8 and the number of balancing circuit switches S1, S2, S3, S4 perform a cell balancing operation of the number of battery cells 80, 82, 84, 86 of the battery module 50. In the illustrated example of FIG. 2, each of the number of balancing circuit switches S1, S2, S3, S4 includes a metal-oxide semiconductor field-effect transistor (MOSFET). Alternatively, the number of balancing circuit switches S1, S2, S3, S4 may include other types of circuit switches known in the art.

The circuit board assembly 100 also includes a second PCB 102. The second PCB 102 includes a number of resistor-capacitor (RC) low-pass filters, and an analog front-end (AFE) chip 104 that at least monitors a voltage and a temperature of the number of battery cells 80, 82, 84, 86 of the battery module 50. In the illustrated example of FIG. 2, the second PCB 102 includes four RC low-pass filters. Each of the RC low-pass filters includes a resistor R1, R2, R3, R4 and a capacitor C1, C2, C3, C4. The RC low-pass filters help to filter out electrical noise so that cell voltages V1, V2, V3, V4 across the battery cells 80, 82, 84, 86 can be measured more accurately. For example, the voltage V1 across the battery cell 80 is filtered through a RC low-pass filter that includes the resistor R1 and the capacitor C1. In some examples, the second PCB 102 is made of a dielectric material.

Further, the AFE chip 104 is a monitoring chip equipped with multiple sampling channels to monitor the cell voltages V1, V2, V3, V4 and the temperature of each battery cell 80, 82, 84, 86. The AFE chip 104 monitors the cell voltage, current, and temperature of the battery module 50 in real time and prevents excessive charging/discharging of each battery cell 80, 82, 84, 86, thereby maintaining the battery module 50 in a balanced state. In some examples, the AFE chip 104 may include a 16-bit analog-to-digital converter (ADC), a high-precision voltage reference, a high-voltage multiplexer, a serial peripheral interface (SPI) or inter-integrated circuit (I2C) interface, and the like.

The circuit board assembly 100 further includes a first connector 112 that connects the first PCB 106 with the second PCB 102. In some examples, the first connector 112 may embody a surface-mount device connector with Teflon coated wires. The first connector 112 communicably couples the AFE chip 104 with the balancing resistors R5, R6, R7, R8 and the balancing circuit switches S1, S2, S3, S4.

The circuit board assembly 100 further includes a second connector 114 that connects the first PCB 106 with the number of battery cells 80, 82, 84, 86. In some examples, the second connector 114 may embody a surface-mount device connector with 18 American wire gauge (AWG) wires or any other equivalent wires. The second connector 114 is connected with the battery cells 80, 82, 84, 86 via the fuses F0, F1, F2, F3, F4.

If the AFE chip 104 detects one or more imbalanced battery cells 80, 82, 84, 86 in the battery module 50, for example if one or more battery cells 80, 82, 84, 86 are overcharged, the cell balancing operation of the imbalanced battery cells 80, 82, 84, 86 is performed. To facilitate the cell balancing operation, the AFE chip 104 communicates with and sends a signal to a corresponding balancing circuit switch S1, S2, S3, S4 of the imbalanced battery cells 80, 82, 84, 86. Upon receiving the signal from the AFE chip 104, via the first connector 112, the balancing circuit switches S1, S2, S3, S4 associated with the imbalanced battery cells 80, 82, 84, 86 are disposed in a closed state. Accordingly, the imbalanced battery cells 80, 82, 84, 86 start discharging excess charge to the corresponding balancing resistor R5, R6, R7, R8, thereby performing the cell balancing operation of the imbalanced battery cells 80, 82, 84, 86.

Moreover, the AFE chip 104 tracks the cell balancing operation and stops the discharging process upon reaching a desired value of the charge in the corresponding battery cells 80, 82, 84, 86. It should be noted that during the cell balancing operation of the number of battery cells 80, 82, 84, 86, a significant amount of heat is generated when the excess charge is passed through the associated balancing resistor R5, R6, R7, R8. The heat generated during the cell balancing operation of the number of battery cells 80, 82, 84, 86 is dissipated via the first PCB 106.

Figure 3:
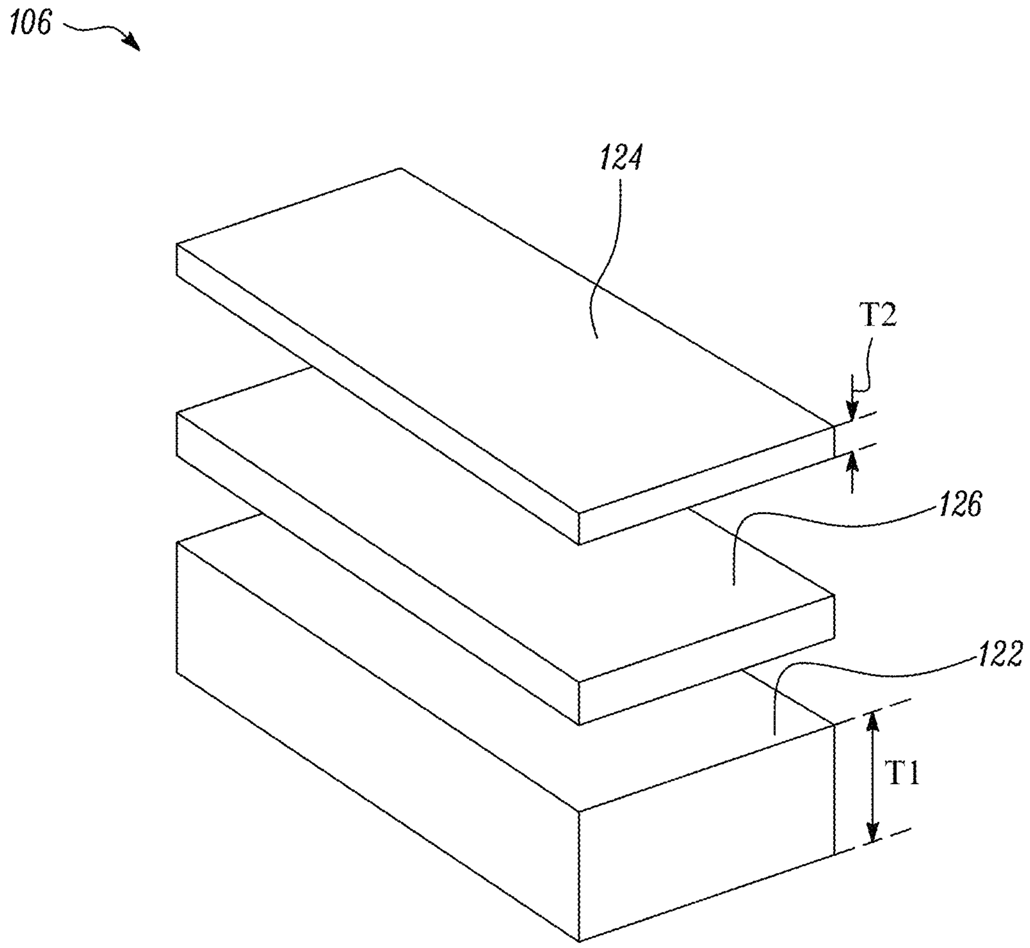
FIG. 3 is a schematic perspective view of a first printed circuit board (PCB) of the circuit board assembly of FIG. 2, according to an example of the present disclosure.

Referring to FIG. 3, the first PCB 106 includes one or more metallic layers 122, 124. Specifically, the first PCB 106 includes a first metallic layer 122. The first PCB 106 also includes a second metallic layer 124 disposed opposite to the first metallic layer 122. The metallic layer 122 is hereinafter interchangeably referred to as the first metallic layer 122. The metallic layer 124 is hereinafter interchangeably referred to as the second metallic layer 124. The first PCB 106 further includes a dielectric layer 126 disposed between the first metallic layer 122 and the second metallic layer 124. Moreover, the first metallic layer 122 includes an aluminum layer and the second metallic layer 124 includes a copper layer. The aluminum layer has low thermal resistance, therefore the aluminum layer may quickly dissipate heat, thereby improving heat dissipation rate via the first PCB 106. Further, a thickness T1, T2 of the first metallic layer 122 and the second metallic layer 124 is variable based on a required heat dissipation rate of the first PCB 106. In an example, the thickness T1, T2 may be increased to reduce a time required to dissipate heat. In some examples, the thickness T1 of the first metallic layer 122 may lie between 1 mm and 2 mm. Moreover, dimensions, i.e., a length and a width, of the first PCB 106 may vary based on a total number of the battery cells 80, 82, 84, 86 associated with the battery module 50.

Figure 4:
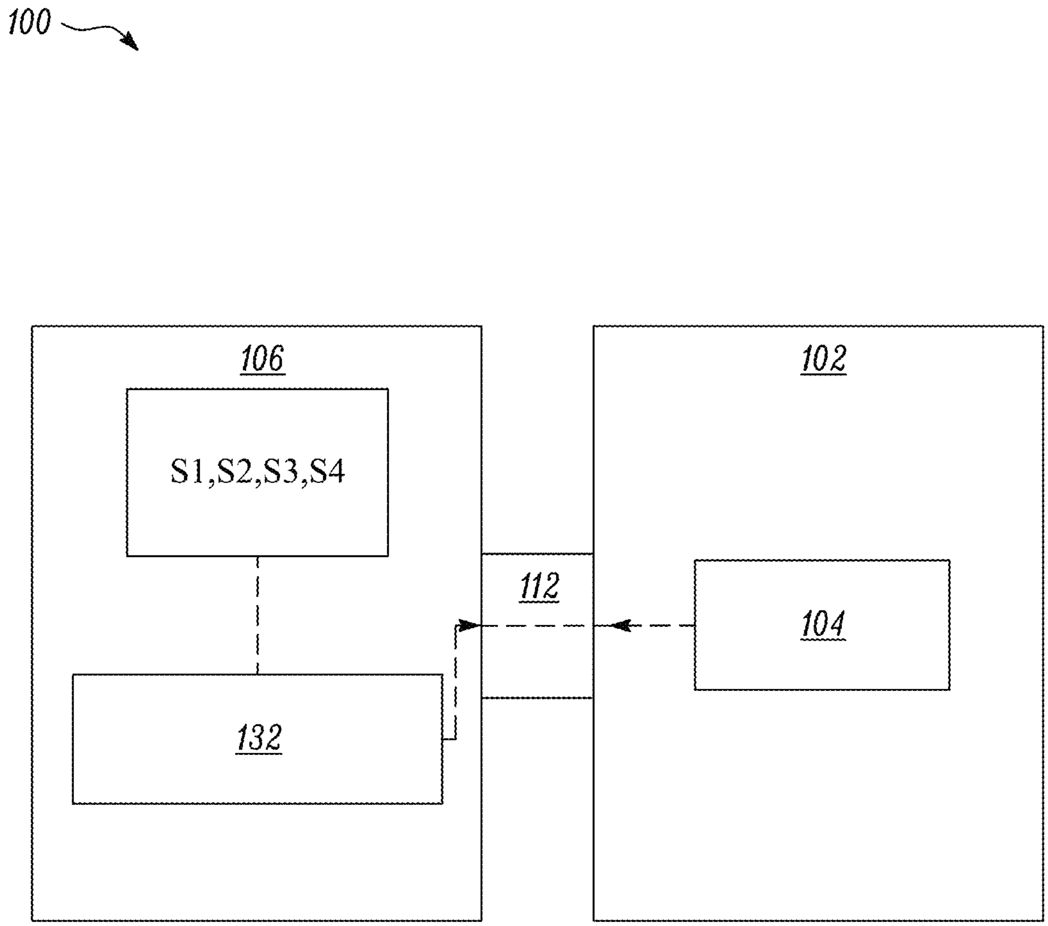
FIG. 4 is a schematic diagram of the first PCB and a second PCB of the battery module of FIG. 2 connected via a first connector, according to an example of the present disclosure.

Referring now to FIG. 4, the first PCB 106 or the second PCB 102 includes a communication chip 132. The communication chip 132 communicably couples the AFE chip 104 with each of the number of balancing circuit switches S1, S2, S3, S4. The communication chip 132 may employ a digital technique to enable a two-way communication between the AFE chip 104 and the first PCB 106. The communication chip 132 may reduce a number of communication cables that may be required to provide communication between the AFE chip 104 and each balancing circuit switch S1, S2, S3, S4. In the illustrated example of FIG. 4, the communication chip 132 is disposed on the first PCB 106. However, the communication chip 132 may be disposed on the second PCB 102.

Figure 5:
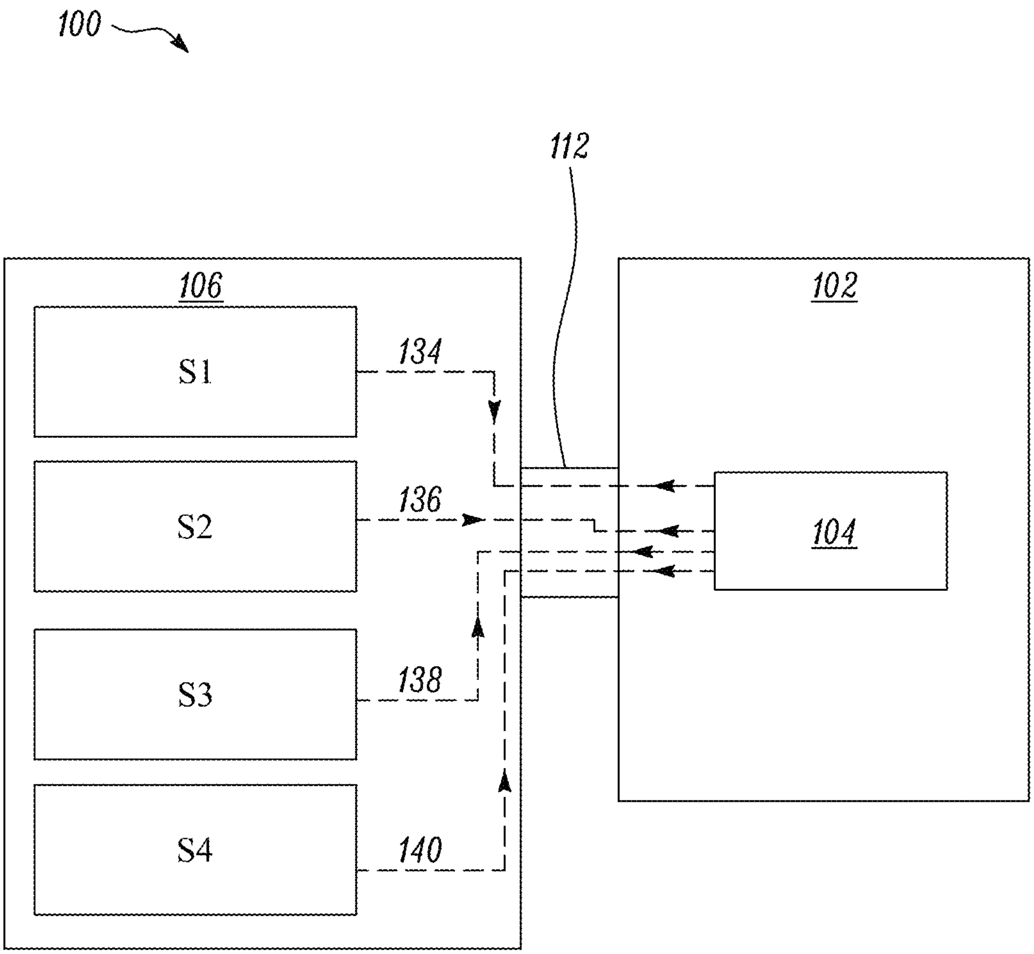
FIG. 5 is a schematic circuit diagram of the first PCB and the second PCB of connected via the first connector, according to another example of the present disclosure.

Referring to FIG. 5, in some examples, the circuit board assembly 100 further includes a number of communication cables 134, 136, 138, 140. The AFE chip 104 is communicably coupled with each balancing circuit switch S1, S2, S3, S4 via a corresponding communication cable 134, 136, 138, 140 from the number of communication cables 134, 136, 138, 140. In such an example, a total number of the communication cables 134, 136, 138, 140 may correspond to the total number of balancing circuit switches S1, S2, S3, S4.

It is to be understood that individual features shown or described for one embodiment may be combined with individual features shown or described for another embodiment. The above-described implementation does not in any way limit the scope of the present disclosure. Therefore, it is to be understood although some features are shown or described to illustrate the use of the present disclosure in the context of functional segments, such features may be omitted from the scope of the present disclosure without departing from the spirit of the present disclosure as defined in the appended claims.

INDUSTRIAL APPLICABILITY

The present disclosure relates to the circuit board assembly 100 for the battery module 50 and a method 200 of dissipating heat generated in the circuit board assembly 100 for the battery module 50. The circuit board assembly 100 includes a split architecture. The circuit board assembly 100 may improve the heat dissipation from the first PCB 106. The circuit board assembly 100 described herein may improve a health of the battery module 50. The circuit board assembly 100 includes the first PCB 106 including the first metallic layer 122 and the second metallic layer 124. The first metallic layer 122 includes the aluminum layer herein. Inclusion of the aluminum layer which has very low thermal resistance may ensure rapid heat dissipation through the first PCB 106. Thus, the heat generated during the cell balancing operation of the number of battery cells 80, 82, 84, 86 may be quickly dissipated, thereby enhancing a longevity of the battery module 50 and ensuring an efficient operation of the battery module 50. In some examples, incorporation of the first PCB 106 having the aluminum layer may increase a heat dissipation rate of the first PCB 106 by, for example, between 5 times and 12 times as compared to conventional PCBs that only include a dielectric layer.

Further, incorporation of the first PCB 106 having the aluminum layer may allow reduction in a size of the first PCB 106 and may provide higher cell balancing currents. Furthermore, the first PCB 106 as described herein may allow easier replacement of the balancing resistors R5, R6, R7, R8 and the balancing circuit switches S1 S2, S3, S4, in case of failure.

In some examples, the circuit board assembly 100 includes the communication chip 132 that communicably couples the AFE chip 104 with each of the number of balancing circuit switches S1, S2, S3, S4. The communication chip 132 may reduce a total number of communication cables 134, 136, 138, 140 that may be otherwise required to communicably couple the AFE chip 104 with each of the number of balancing circuit switches S1 S2, S3, S4.

Figure 6:
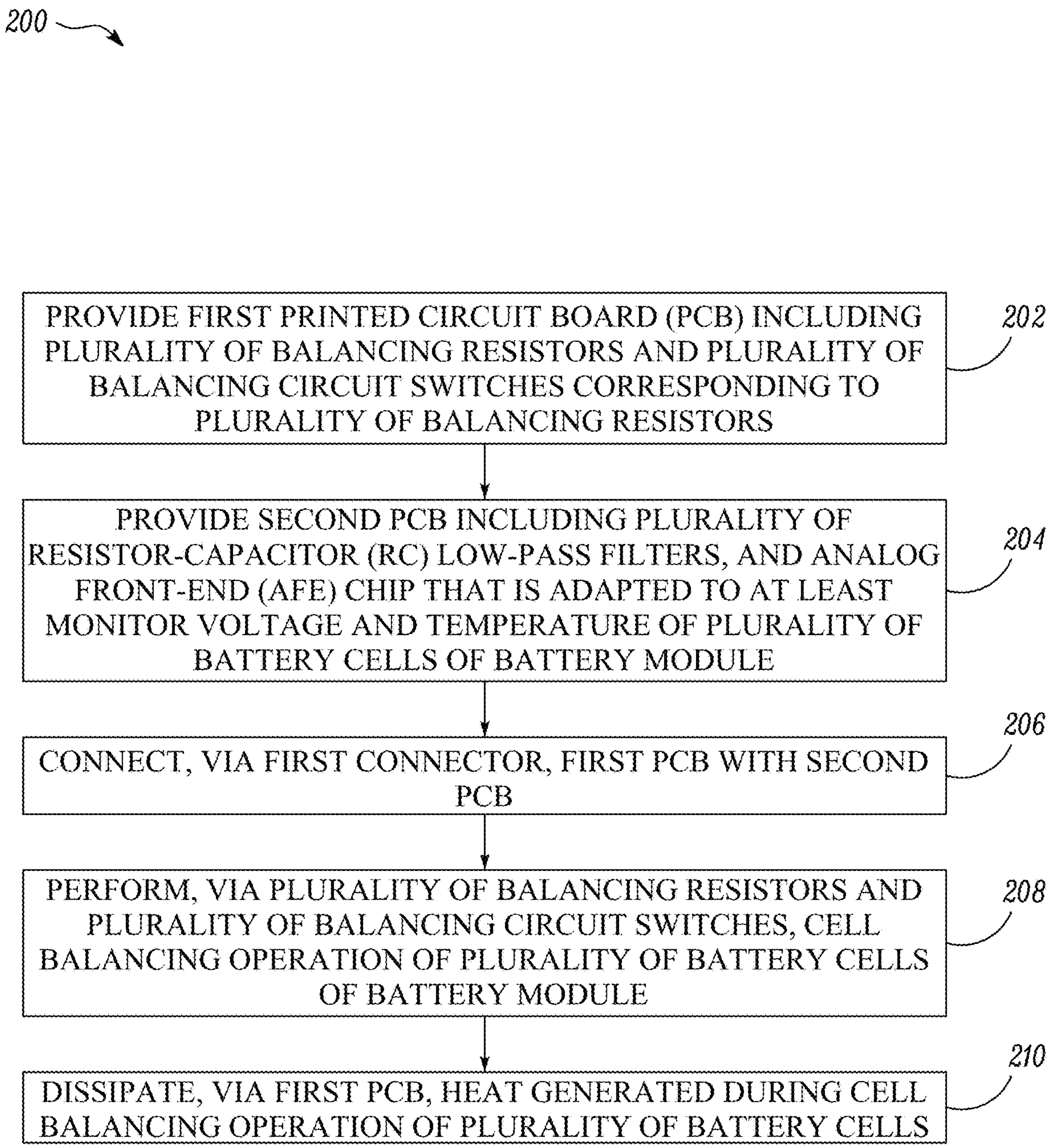
FIG. 6 is a flowchart for a method of dissipating heat generated in the circuit board assembly of FIG. 2, according to an example of the present disclosure.

FIG. 6 illustrates a flowchart for the method 200 of dissipating heat generated in the circuit board assembly 100 for the battery module 50. At step 202, the first printed circuit board (PCB) 106 is provided. The first PCB 106 includes the number of balancing resistors R5, R6, R7, R8 and the number of balancing circuit switches S1, S2, S3, S4 corresponding to the number of balancing resistors R5, R6, R7, R8. The first PCB 106 includes the one or more metallic layers 122, 124.

At step 204, the second PCB 102 is provided. The second PCB 102 includes the number of resistor-capacitor (RC) low-pass filters, and the analog front-end (AFE) chip 104 that at least monitors the voltage V1, V2, V3, V4 and the temperature of the number of battery cells 80, 82, 84, 86 of the battery module 50.

At step 206, the first connector 112 connects the first PCB 106 with the second PCB 102.

At step 208, the cell balancing operation of the number of battery cells 80, 82, 84, 86 of the battery module 50 is performed via the number of balancing resistors R5, R6, R7, R8 and the number of balancing circuit switches S1, S2, S3, S4.

At step 210, the heat generated during the cell balancing operation of the number of battery cells 80, 82, 84, 86 is dissipated via the first PCB 106.

The method 200 further includes a step (not shown) at which the second connector 114 connects the first PCB 106 with the number of battery cells 80, 82, 84, 86.

The method 200 further includes a step (not shown) at which the communication chip 132 disposed on the first PCB 106 or the second PCB 102 communicably couples the AFE chip 104 with each of the number of balancing circuit switches S1, S2, S3, S4.

The method 200 further includes a step (not shown) at which the number of communication cables 134, 136, 138, 140 communicably couple the AFE chip 104 with the number of balancing circuit switches S1, S2, S3, S4. The AFE chip 104 is communicably coupled with each balancing circuit switch S1, S2, S3, S4 via a corresponding communication cable 134, 136, 138, 140 from the number of communication cables 134, 136, 138, 140.

It should be noted that the steps 202, 204, 206, 208, 210 of the method 200 may be performed in a sequence that is different from that explained in relation to FIG. 6. Further, various steps 202, 204, 206, 208, 210 can be performed together.

While aspects of the present disclosure have been particularly shown and described with reference to the embodiments above, it will be understood by those skilled in the art that various additional embodiments may be contemplated by the modification of the disclosed machines, systems and methods without departing from the spirit and scope of what is disclosed. Such embodiments should be understood to fall within the scope of the present disclosure as determined based upon the claims and any equivalents thereof.

What is claimed is:

1. A circuit board assembly for a battery module, the circuit board assembly comprising:

a first printed circuit board (PCB) including a plurality of balancing resistors and a plurality of balancing circuit switches corresponding to the plurality of balancing resistors, wherein the first PCB includes at least one metallic layer, wherein the plurality of balancing resistors and the plurality of balancing circuit switches perform a cell balancing operation of a plurality of battery cells of the battery module, and wherein heat generated during the cell balancing operation of the plurality of battery cells is dissipated via the first PCB;

a second PCB including a plurality of resistor-capacitor (RC) low-pass filters, and an analog front-end (AFE) chip that is adapted to at least monitor a voltage and a temperature of the plurality of battery cells of the battery module; and a first connector adapted to connect the first PCB with the second PCB.

2. The circuit board assembly of claim 1, wherein the first PCB includes a first metallic layer, a second metallic layer, and a dielectric layer disposed between the first metallic layer and the second metallic layer, and wherein the first metallic layer includes an aluminum layer, and the second metallic layer includes a copper layer.

3. The circuit board assembly of claim 2, wherein a thickness of the first metallic layer and the second metallic layer is variable based on a required heat dissipation rate of the first PCB.

4. The circuit board assembly of claim 1 further comprising a second connector adapted to connect the first PCB with the plurality of battery cells.

5. The circuit board assembly of claim 1, wherein the second PCB is made of a dielectric material.

6. The circuit board assembly of claim 1, wherein each of the plurality of balancing circuit switches includes a metal-oxide-semiconductor field-effect transistor (MOSFET).

7. The circuit board assembly of claim 1, wherein at least one of the first PCB and the second PCB includes a communication chip, and wherein the communication chip communicably couples the AFE chip with each of the plurality of balancing circuit switches.

8. The circuit board assembly of claim 1 further comprising a plurality of communication cables, wherein the AFE chip is communicably coupled with each balancing circuit switch via a corresponding communication cable from the plurality of communication cables.

9. A battery module comprising:

a housing;

a plurality of battery cells disposed within the housing; and a circuit board assembly disposed within the housing and in communication with the plurality of battery cells, the circuit board assembly including:

a first printed circuit board (PCB) including a plurality of balancing resistors and a plurality of balancing circuit switches corresponding to the plurality of balancing resistors, wherein the first PCB includes at least one metallic layer, wherein the plurality of balancing resistors and the plurality of balancing circuit switches perform a cell balancing operation of the plurality of battery cells of the battery module, and wherein heat generated during the cell balancing operation of the plurality of battery cells is dissipated via the first PCB;

a second PCB including a plurality of resistor-capacitor (RC) low-pass filters, and an analog front-end (AFE) chip that is adapted to at least monitor a voltage and a temperature of the plurality of battery cells of the battery module; and a first connector adapted to connect the first PCB with the second PCB.

10. The battery module of claim 9, wherein the first PCB includes a first metallic layer, a second metallic layer, and a dielectric layer disposed between the first metallic layer and the second metallic layer, and wherein the first metallic layer includes an aluminum layer, and the second metallic layer includes a copper layer.

11. The battery module of claim 10, wherein a thickness of the first metallic layer and the second metallic layer is variable based on a required heat dissipation rate of the first PCB.

12. The battery module of claim 9, wherein the circuit board assembly further includes a second connector adapted to connect the first PCB with the plurality of battery cells.

13. The battery module of claim 9, wherein the second PCB is made of a dielectric material.

14. The battery module of claim 9, wherein each of the plurality of balancing circuit switches includes a metal-oxide-semiconductor field-effect transistor (MOSFET).

15. The battery module of claim 9, wherein at least one of the first PCB and the second PCB includes a communication chip, and wherein the communication chip communicably couples the AFE chip with each of the plurality of balancing circuit switches.

16. The battery module of claim 9, wherein the circuit board assembly further includes a plurality of communication cables, and wherein the AFE chip is communicably coupled with each balancing circuit switch via a corresponding communication cable from the plurality of communication cables.

* * * * *